(12) United States Patent
Pu et al.

(10) Patent No.: US 10,291,245 B2
(45) Date of Patent: May 14, 2019

(54) DEVICE AND METHOD FOR CORRECTING ERROR ESTIMATION OF ANALOG-TO-DIGITAL CONVERTER

(71) Applicant: NO. 24 RESEARCH INSTITUTE OF CHINA ELECTRONICS TECHNOLOGY GROUP CORPORATION, Chongqing (CN)

(72) Inventors: Jie Pu, Chongqing (CN); Gangyi Hu, Chongqing (CN); Xiaofeng Shen, Chongqing (CN); Xueliang Xu, Chongqing (CN); Dongbing Fu, Chongqing (CN); Ruitao Zhang, Chongqing (CN); Youhua Wang, Chongqing (CN); Yuxin Wang, Chongqing (CN); Guangbing Chen, Chongqing (CN); Ruzhang Li, Chongqing (CN)

(73) Assignee: NO. 24 RESEARCH INSTITUTE OF CHINA ELECTRONIC TECHNOLOGY, Chongqing (CN)

( * ) Notice: Subject to any disclaimer, the term of this patent is extended or adjusted under 35 U.S.C. 154(b) by 0 days.

(21) Appl. No.: 15/742,835

(22) PCT Filed: Aug. 20, 2015

(86) PCT No.: PCT/CN2015/087676
§ 371 (c)(1),
(2) Date: Jan. 8, 2018

(87) PCT Pub. No.: WO2017/004869
PCT Pub. Date: Jan. 12, 2017

(65) Prior Publication Data
US 2018/0358976 A1 Dec. 13, 2018

(30) Foreign Application Priority Data
Jul. 8, 2015 (CN) .......................... 2015 1 0401578

(51) Int. Cl.
*H03M 1/06* (2006.01)
*H03M 1/10* (2006.01)

(52) U.S. Cl.
CPC .......... *H03M 1/0609* (2013.01); *H03M 1/10* (2013.01)

(58) Field of Classification Search
CPC ........ H03M 1/12; H03M 1/0609; H03M 1/10; H03M 1/06
(Continued)

(56) References Cited

U.S. PATENT DOCUMENTS 7,583,946 B2 * 9/2009 Kerth ....................... H04B 1/28
331/19
7,675,441 B2 * 3/2010 Sheng ................. H03M 1/1014
341/120

(Continued)

FOREIGN PATENT DOCUMENTS

| CN | 102739252 A | 10/2012 |
| CN | 104038226 A | 9/2014 |
| CN | 104734711 A | 6/2015 |

OTHER PUBLICATIONS

Apr. 13, 2016 Search Report issued in International Patent Application No. PCT/CN2015/087676.
(Continued)

*Primary Examiner* — Peguy Jean Pierre
(74) *Attorney, Agent, or Firm* — Oliff PLC

(57) ABSTRACT

The present invention provides a device and method for correcting error estimation of an analog-to-digital converter. The method comprises: according to a preset initial value of a correction parameter, generating a control signal and finely tuning a digital control delay cell, adjusting a delay amount, and correcting a clock phase error between channels; according to the initial value of a correction parameter, correcting a gain error between channels, generating a (Continued)

general correction signal, buffering the general correction signal and triggering a counting cell to start counting, and meanwhile calling the general correction signal in a buffer and generating a preliminary estimation result by using a cyclic correlation method; when counting up to a preset value, setting enable ends of a low-pass filter accumulating cell and a correction parameter updating cell, generating an error estimation result from the preliminary estimation result and latching the error estimation result, updating a clock correction parameter and a gain correction parameter according to a gradient descent method, and latching the updated clock correction parameter and gain correction parameter, and resetting to carry out cyclic estimation correction. According to the present invention, in the case where a few effective sample points are used, the estimation accuracy is improved and the convergence rate of the estimation correction is increased.

15 Claims, 9 Drawing Sheets

(58) Field of Classification Search
USPC .................. 341/118, 120, 155, 159, 141, 139
See application file for complete search history.

(56) References Cited

U.S. PATENT DOCUMENTS

2007/0069937 A1* 3/2007 Balakrishnan ...... H03M 1/0624
341/161
2010/0164763 A1 7/2010 Kidambi
2012/0268299 A1* 10/2012 Kidambi ............. H03M 1/1052
341/155

OTHER PUBLICATIONS

Apr. 13, 2016 Written Opinion issued in International Patent Application No. PCT/CN2015/087676.

* cited by examiner

DEVICE AND METHOD FOR CORRECTING ERROR ESTIMATION OF ANALOG-TO-DIGITAL CONVERTER

BACKGROUND OF THE PRESENT INVENTION

Field of Invention

The present invention belongs to the technical field of Analog-to-Digital converter (ADC), and more specifically, in particular to a device and method for correcting error estimations of gain and clock phase of a dual-channel time division multiplexing converter.

Description of Related Arts

In recent years, time-interleaved analog-to-digital converters (TI ADCs) have drawn increasing attention in applications that require an extremely high sampling rate and sampling accuracy (i.e., current simple ADCs cannot achieve such a high sampling rate and accuracy). In a TI ADC with M channel sub-ADCs, each channel sub-ADC operates at Fs/M, wherein Fs is the sampling rate of the TI ADC. A multiplexer (MUX) is used to combine an output from each channel sub-ADC at Fs to produce a sample rating converter operating at Fs. However, due to process error, temperature, voltage, environmental disturbance, and other factors, there are gain and clock phase errors among the channels and the errors can change over time. The errors cause error spurious components at $k \cdot f_s/L \pm f_{in}$ ($f_s$ is the sampling frequency of an A/D converter, $f_{in}$ is the frequency of an input signal, L is the number of channels, k=1, 2, ..., L−1), thus greatly reducing the performance of the TI ADC.

The existing error estimation correction method is a conventional method based on statistical method, which is proposed by M. Seo et al., where estimation correction is performed for an error parameter mainly by using an ADC's own input sampling signal and the working of the ADC itself is not affected during the correction; as long as the input sampling signal is a band-limited generalized stationary random signal and the signal is larger than a certain range, the gain and clock phase error estimations can be eliminated.

However, the error estimation correction method has the following disadvantages:

First, in the process of error correction, the accuracy of estimation is directly proportional to the number of sample points of a valid input sampling signal used for each estimation. When a few sample points of the valid input sampling signal are used, the estimation effect is poor. It will cause an estimation error, which will affect the correction effect.

Second, when many sample points of the valid input sampling signal are used in a single estimation, the time used for the single estimation is increased and the convergence rate of the real-time estimation correction is reduced.

SUMMARY OF THE PRESENT INVENTION

In view of the above-mentioned disadvantages of the prior art, an object of the present invention is to provide a device and method for correcting error estimation of an analog-to-digital converter, to solve the problem in the prior art that when many sample points are used under a relatively high conversion accuracy requirement, time used for a single estimation is increased, causing low convergence rate of the estimation correction.

To achieve the above object and other related objects, a device for correcting error estimation of an analog-to-digital converter is provided. The device at least comprises:

a dual-channel time division multiplexing analog-to-digital converter, adapted to using a reference clock signal and a correction clock signal for sampling in a reference channel and a correction channel, respectively, and generating a corresponding first path of digital signal and second path of digital signal; and an adaptive digital signal processor, adapted to calculating a clock phase error estimation result and a gain error estimation result of the second path of digital signal according to a preset initial value of a correction parameter updating cell, the first path of digital signal and the second path of digital signal, wherein the initial value of the correction parameter updating cell comprises an initial value of a gain correction parameter and an initial value of a time correction parameter; and further adapted to adopting a gradient descent method, updating the time correction parameter according to the clock phase error estimation result, and updating the gain correction parameter according to the gain error estimation result.

The object of the present invention is also to provide an adaptive digital signal processor for use in the device for correcting error estimation of an analog-to-digital converter. The adaptive digital signal processor at least comprises:

a gain correcting cell, adapted to performing gain correction for the second path of digital signal according to the initial value of the gain correction parameter, and generating a second path of correction signal;

a buffer cell, adapted to buffering the first path of digital signal and the second path of correction signal;

a segmented error estimating cell, adapted to calling the first path of digital signal and the second path of correction signal, and using a cyclic correlation method for processing, and generating a preliminary estimation result, wherein the preliminary estimation result comprises a preliminary estimation result of a gain error and a preliminary estimation result of a clock phase error;

a low-pass filtering and accumulating cell, adapted to processing the preliminary estimation result, and generating an error estimation result when receiving a corresponding setting signal;

a counting cell, adapted to sending the setting signal to the low-pass filter accumulating cell and a correction parameter updating cell respectively according to a clock signal sampling cycle and sending a reset signal to each cell; and the correction parameter updating cell, adapted to updating the clock correction parameter and the gain correction parameter according to the gradient descent method when receiving the corresponding setting signal, and latching the updated clock correction parameter and gain correction parameter.

As a preferred solution of the above-mentioned device for correcting error estimation of an analog-to-digital converter, the device further comprises:

a delay cell, comprising a fixed delay cell and a digital control delay cell, the fixed delay cell is adapted to setting a delay in a reference channel, generating a reference clock delay amount, and controlling the clock phase of the first path of digital signal, and the digital control delay cell is adapted to generating a control signal according to a time correction parameter, and finely tuning the clock phase of the second path of digital signal.

Another object of the present invention is to provide a method for correcting error estimation of an analog-to-digital converter, and the method comprises:

step 1, presetting an initial value of a correction parameter updating cell, wherein the initial value of the correction parameter updating cell comprises an initial value of a clock correction parameter and an initial value of a gain correction parameter;

step 2, calling the initial value of the clock correction parameter for decoding to generate a control signal, and finely tuning the delay amount of a digital control delay cell according to the control signal, correcting a phase error of the sampling clock of a second path of digital signal relative to the sampling clock of a first path of digital signal;

step 3, performing gain correction for the second path of digital signal according to the initial value of the gain correction parameter, generating a second path of correction signal, buffering and coupling the first path of digital signal and the second path of correction signal, generating a general correction signal, and triggering a counting cell to start counting;

step 4, calling the buffered first path of digital signal and second path of correction signal and using a cyclic correlation method for processing, and generating a preliminary estimation result; and step 5, when the counting cell counts up to a preset value and an edge of a clock signal arrives, setting enable ends of a low-pass filter accumulating cell and a correction parameter updating cell, generating an error estimation result from the preliminary estimation result, and updating and latching the clock correction parameter and the gain correction parameter according to the error estimation result.

As described above, the device and method for correcting error estimation of an analog-to-digital converter according to the present invention have the following beneficial effects:

Correcting a clock signal sampled between channels and the second path of digital signal by setting an adaptive signal processor, obtaining the corresponding clock phase error estimation result and gain error estimation result through the first path of digital signal and the second path of correction signal, latching the clock phase error estimation result and the gain error estimation result, and obtaining the corresponding clock correction parameter and gain correction parameter, and feeding them back to the digital control delay cell and the gain correcting cell respectively, to achieve accurate adjustment of the feedback error. When the analog input signal of the TI ADC is within the Nyquist sampling bandwidth, the estimation correction process only needs to utilize output signals normally sampled by two channel sub-ADCs, without the need to additionally add other auxiliary analog signals at a sub-ADC input or sub-ADC circuitry, and the estimation correction process does not depend on the specific circuit implementation structure of a sub-ADC; and each estimation requires fewer effective sample points, and in real-time correction, the requirement for the effective signal duration is reduced, and the convergence rate of the estimation correction is increased; and in the case of the same error estimation accuracy, the correction of the error estimation using a single estimation method can greatly reduce the number of sample points sampled, and at the same time, the convergence rate of the error estimation is greatly reduced.

DESCRIPTION OF COMPONENT MARK NUMBERS 1. clock generating circuit, 2. gain correcting cell, 3. buffer cell, 4. segmented error estimating cell, 5. low-pass filtering and accumulating cell, 6. correction parameter updating cell, 7. counting cell, 8. multiplexer, 9. fixed delay cell, 10. digital control delay cell.

DETAILED DESCRIPTION OF THE PREFERRED EMBODIMENTS

The implementation mode of the present invention will be described below in through specific embodiments. One skilled in the art can easily understand other advantages and effects of the present invention according to contents disclosed by the description. The present invention can also be implemented or applied through other different specific implementation modes. Various modifications or changes can also be made to all details in the description based on different points of view and applications without departing from the spirit of the present invention. Please refer to FIG. 1-FIG. 12. It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Figure 1:
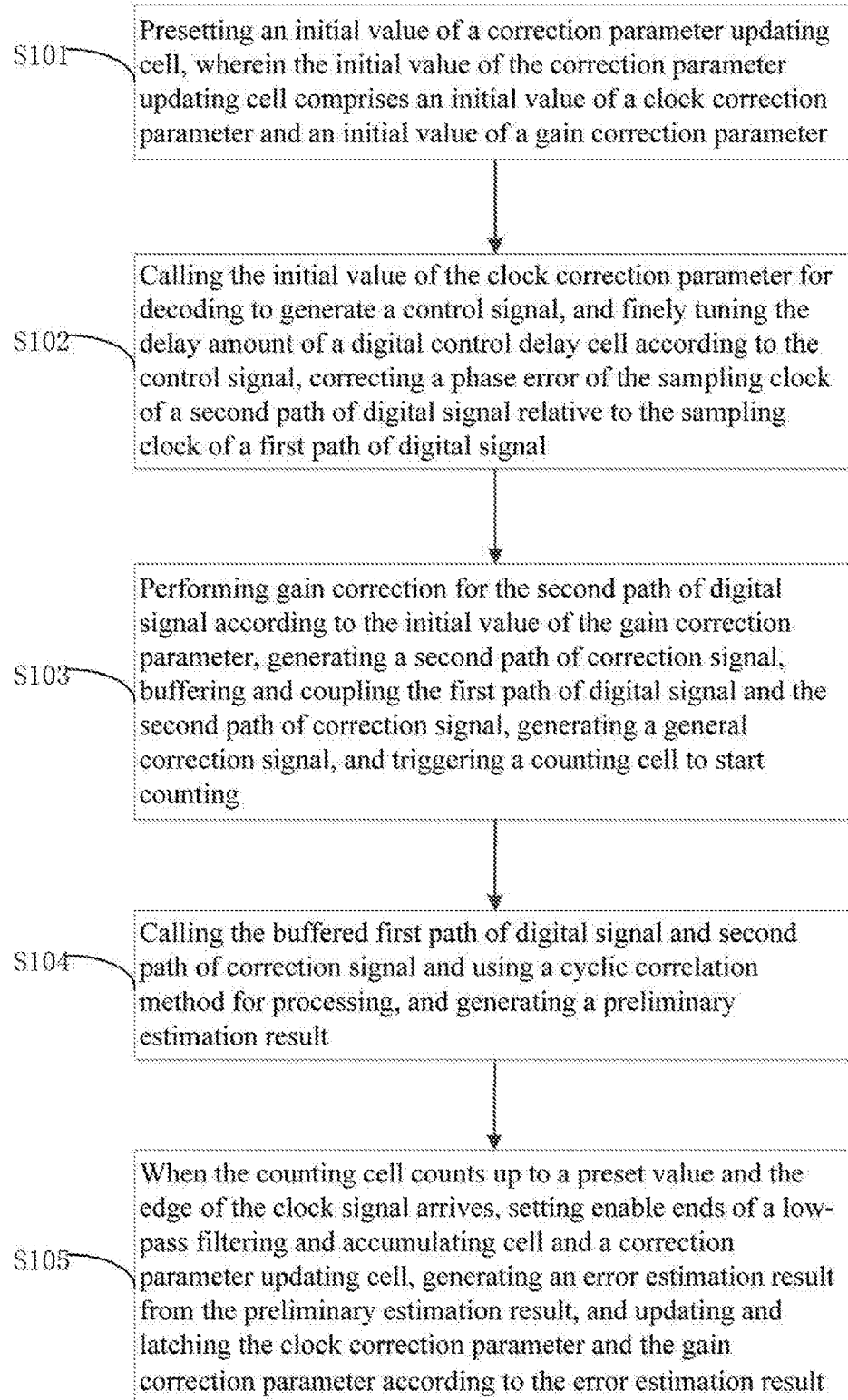
FIG. 1 shows a flow chart of a method for correcting error estimation of an analog-to-digital converter in an embodiment of the present invention.

As shown in FIG. 1, it illustrates a flow chart of a method for correcting error estimation of an analog-to-digital converter in an embodiment of the present invention.

Step 1, an initial value of a correction parameter updating cell 6 is preset, wherein the initial value of the correction parameter updating cell 6 comprises an initial value of a clock correction parameter, an initial value of a gain correction parameter, and an initial value of a parameter updating step.

Specifically, the parameter updating step may be a fixed value or a group of parameters, and both of the clock correction parameter and the gain correction parameter may be fixed values.

Step 2, the initial value of the clock correction parameter is called for decoding to generate a control signal, and the delay amount of a digital control delay cell 10 is finely tuned according to the control signal, correcting a phase error of the sampling clock of a second path of digital signal relative to the sampling clock of a first path of digital signal.

Wherein, the analog-to-digital converter herein is a dual-channel time division multiplexing analog-to-digital converter; taking the first channel sub-ADC as a reference channel, setting a fixed delay cell 9 in the reference channel, obtaining a reference clock delay amount output by the reference channel; taking the second channel sub-ADC as a correction channel, setting the digital control delay cell 10 in the correction channel, obtaining a correction clock delay amount output by the correction channel.

The clock correction parameter is decoded into a binary code, taking the binary code as a control signal, when the actual delay amount corresponding to the control signal is less than the reference clock delay amount, the clock phase of the second path of digital signal is shifted forward; when the actual delay amount corresponding to the control signal is greater than the reference clock delay amount, the clock phase of the second path of digital signal is shifted backward. Step 3, gain correction is performed for the second path of digital signal according to the initial value of the gain correction parameter, generating a second path of correction signal, buffering and coupling the first path of digital signal and the second path of correction signal, generating a general correction signal, and triggering a counting cell 7 to start counting.

Wherein, a multiplier is used to obtain the product of the second path of digital signal and the gain correction parameter, and an adder is used to obtain the sum of the output of the multiplier and the second path of digital signal; or an adder is used to obtain the sum of the gain correction parameter and an original multiple, and a multiplier is used to obtain the product of the second path of digital signal and the output of the adder.

Specifically, gain error correction is performed according to the second path of digital signal, outputting a second path of correction signal, and timing sequences of the first path of digital signal and the second path of correction signal are aligned, and a multiplexer 8 is used to couple the first path of digital signal and the second path of correction signal to generate a general correction signal.

Specifically, when the first path of digital signal and the second path of correction signal are received, the first path of digital signal and the second path of correction signal are buffered, and the counting cell 7 is triggered to start counting.

Step 4, calling the first path of digital signal and the second path of correction signal being buffered, using a cyclic correlation method for processing, generating a preliminary estimation result.

Wherein, the preliminary estimation result comprises a preliminary estimation result of a gain error and a preliminary estimation result of a clock phase error.

Specifically, the first path of digital signal and the second path of correction signal are called, a gain error loss function is calculated according to the cyclic correlation method, generating a corresponding preliminary estimation result of the gain error, and a clock phase error loss function is calculated according to the cyclic correlation method, generating a corresponding preliminary estimation result of the clock phase error.

Step 5, when the counting cell 7 counts up to a preset value and an edge of a clock signal arrives, setting enable ends of a low-pass filter accumulating cell 5 and a correction parameter updating cell 6, generating an error estimation result from the preliminary estimation result, and updating and latching the clock correction parameter and the gain correction parameter according to the error estimation result.

When the enable end of the low-pass filtering and accumulating cell 5 is set, the preliminary estimation result is processed, generating an error estimation result. The error estimation result comprises a gain error estimation result and a clock phase error estimation result. When the enable end of the correction parameter updating cell 6 is set, latching the error estimation result, calling the error estimation result, updating the clock correction parameter and the gain correction parameter according to a gradient descent method, and latching the updated clock correction parameter and gain correction parameter.

Wherein, the counting cell 7 sets two time nodes according to the cycle of the clock signal, and sets the low-pass filter accumulating cell 5 and the correction parameter updating cell 6, respectively; when the counting cell 7 counts up to a set value and when it goes to the setting signal according to the cycle of the clock signal, the low-pass filtering and accumulating cell 5 and the correction parameter updating cell 6 are set.

In a preferred embodiment, after step 1 to step 5 are performed, only the rough error estimation and correction can be performed, and the calculation can not be performed accurately to achieve the purpose of accurate error estimation and correction. Therefore, after step 5 is performed, the method further comprises: step 6: when the counting cell 7 outputs a reset signal, the enable ends of the buffer cell 3, the low-pass filtering and accumulating cell 5, the correction parameter updating cell 6, the segmented error estimating cell 4, the low-pass filtering and accumulating cell 5 and the counting cell 7 are set, and then repeating steps 2 to 5.

Specifically, working clocks of the gain correcting cell 2, the buffer cell 3, the counting cell 7, the segmented error estimation cell 4, and the low-pass filtering and accumulating cell 5 are the clock signal. The setting for the enable ends of the low-pass filter accumulating cell and the correction parameter updating cell 6 is completed according to the cycle of the clock signal, and each cell in the adaptive digital signal processor is reset.

In addition, the analog-to-digital converter may also be a multi-channel time division multiplexing analog-to-digital converter. One of the channels is used as a reference channel and it is used as a reference signal, while the other channels in the multiple channels are channels to be corrected. Similarly, step 2 to step 6 of the method for correcting error estimation of an analog-to-digital converter are performed in sequence, and calculating sampling signals in the channels to be corrected in the multiple channels.

In this embodiment, when the multi-channel time division multiplexing analog-to-digital converter is a three-channel time division multiplexing analog-to-digital converter, a first channel thereof is a reference channel, and a first path of clock signal and a first path of digital signal corresponding to the first channel are both reference signals. A second path of clock signal and a third path of clock signal as well as a second path of digital signal and a third path of digital signal, corresponding to a second channel and a third channel, all need error estimation and correction.

Wherein, during the clock phase error correction, a delay amount corresponding to the first path of clock signal is used as a reference delay, and the second path of clock signal takes a second path of clock correction parameter as a standard (the first correction takes the initial value of the clock correction parameter as a standard), the digital control delay cell 10 obtains a binary-based control signal according to the second path of clock correction parameter, and finely tunes the clock phase of the second path of clock signal according to the control signal, thereby achieving the purpose of correcting a clock phase error. Secondly, when a third path of clock signal needs to be corrected, the second path of clock signal corrected in the current correction is considered as a reference standard, a binary-based control signal is obtained according to the third path of clock correction parameter, and the clock phase of the third path of clock signal is finely tuned according to the control signal, thereby achieving the purpose of correcting a clock phase error.

During the gain error correction, the second path of digital signal is corrected by using the first path of digital signal as a standard, and the gain correcting cell 2 generates a second path of correction signal from the second path of digital signal according to a second path of gain correction parameter (Note: the first gain error correction takes the initial value of the second path of gain correction parameter as a standard). Similarly, when the gain error correction of the third path of digital signal is performed, a second path of correction signal correspondingly output by the second path of digital signal is used as a standard, and the gain of the third path of digital signal is corrected according to the third path of gain correction parameter, and a third path of correction signal is generated.

The first path of digital signal, the second path of correction signal and the third path of correction signal are buffered, and a gain error loss function and a clock phase error loss function between channels are calculated according to the cyclic correlation method, generating a corresponding preliminary estimation result of the gain error and preliminary estimation result of the clock phase error.

In the correction process of clock phase error and gain phase error, according to the gain error estimation result and the clock phase error estimation result, the clock correction parameter and the gain correction parameter are continuously updated, and multiple cycles of error estimation and correction are completed, so that the final correction accuracy is more accurate.

Before the correction of the analog-to-digital converter, it is necessary to determine the total number of sample points N used for a single estimation, the number of sample points processed for segment estimation $N_1$, and the number of overlapping samples $N_2$ between segments.

The number of segments M satisfies the following relationship:

$$M = \left\lfloor \frac{N - N_1}{N_1 - N_2} \right\rfloor \quad (1)$$

After the number of segments M is determined, N is adjusted as follows:

$$N = M \cdot (N_1 - N_2) + N \quad (2)$$

Wherein the symbol $\lfloor \ \rfloor$ indicates that the value takes the lower limit of the integer and it must satisfy $N_2 < N_1$.

Embodiment 1

In the correction of a dual-channel time division multiplexing analog-to-digital converter (TI ADC), a clock signal generator of the TI ADC generates a first path of clock signal and a second path of clock signal according to a clock signal; and the first path of clock signal and the second path of clock signal are clock signals which are the same in cycle and have a phase difference of 180 degrees. The first channel sub-ADC samples and maintains a input signal during the cycle of the first path of clock signal to provide a first path of digital signal as a reference signal; the second channel sub-ADC samples and maintains the input signal during the cycle of the second path of clock signal to provide the second path of digital signal as a signal to be corrected.

A digital control delay cell (DCDC) is set in the sampling clock path of the second path of digital signal, so that the clock phase can be finely tuned to correct the phase error of the second path of clock signal relative to the first path of clock signal. The output first path of digital signal and second path of digital signal enter an adaptive signal processor to complete the estimation and correction of the gain error and the estimation of the clock phase error. A certain number of sample points are used in each error estimation; the sample points are processed in a segmented manner by using a cyclic correlation method, outputting a preliminary estimation result. The preliminary estimation result is processed by filtering and accumulating to output an error estimation result. A gradient descent method is used to update and converge the correction parameter according to the error estimation result. In the feedback processing, the adaptive signal processor outputs a control signal according to a clock phase error correction parameter, controlling the delay amount of the digital control delay cell 10 to achieve the purpose of correcting the clock phase error. The adaptive signal processor outputs the first path of digital signal and the second path of correction signal and then they are synthesized into an output signal (i.e., the general correction signal) of the TI ADC after passing through a multiplexer 8 (MUX).

Figure 2:
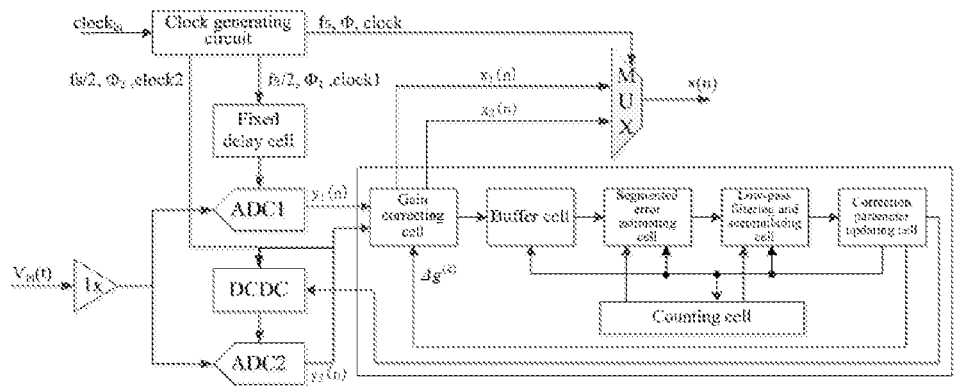
FIG. 2 shows a schematic structural diagram of a device for correcting error estimation of an analog-to-digital converter according to an embodiment of the present invention.

As shown in FIG. 2, it is a schematic structural diagram of a device for correcting error estimation of an analog-to-digital converter according to an embodiment of the present invention, comprising:

a dual-channel time division multiplexing analog-to-digital converter, adapted to using a reference clock signal and a correction clock signal for sampling in a reference channel and a correction channel, respectively, generating a corresponding first path of digital signal and second path of digital signal; and wherein the clock generating circuit 1 generates two paths of clock signals: a reference clock signal and a correction clock signal, which are the same in cycle and have a phase difference being approximately 180 degrees; when the gain correction of the second path of digital signal is performed with the first path of digital signal in the reference channel as a standard and the clock phase of a channel to be corrected is corrected with a fixed delay in an analog clock signal acquired in the reference channel of the analog-to-digital converter as a standard, so that the corrected clock phase is closest to 180 degrees;

a delay cell, which comprises a fixed delay cell 9 and a digital control delay cell 10, the fixed delay cell 9 is adapted to setting a delay in a reference channel, generating a reference clock delay amount, and controlling the clock phase of the first path of digital signal; and the digital control delay cell 10 is adapted to generating a control signal according to a time correction parameter, and finely tuning the clock phase of the second path of digital signal;

a multiplexer 8, adapted to coupling the second path of correction digital signal and the first path of digital signal and outputting a general correction signal;

an adaptive digital signal processor, adapted to calculating a clock phase error estimation result and a gain error estimation result of the second path of digital signal according to a preset initial value of a correction parameter updating cell 6, the second path of digital signal and the first path of digital signal, wherein the initial value of the correction parameter updating cell 6 comprises an initial value of a gain correction parameter and an initial value of a time correction parameter; and further adapted to adopting a gradient descent method, updating the time correction parameter according to the clock phase error estimation result and updating the gain correction parameter according to the gain error estimation result.

Wherein the adaptive digital signal processor comprises:

a gain correcting cell 2, adapted to performing gain correction for the second path of digital signal according to the initial value of the gain correction parameter, and generating a second path of correction signal;

a buffer cell 3, adapted to buffering the first path of digital signal and the second path of correction signal;

a segmented error estimating cell 4, adapted to calling the first path of digital signal and the second path of correction signal, and using a cyclic correlation method for processing, generating a preliminary estimation result, wherein the preliminary estimation result comprises a preliminary estimation result of a gain error and a preliminary estimation result of a clock phase error, wherein the segmented error estimating cell 4 comprises a gain error estimating sub-cell and a clock phase error estimating sub-cell, and the gain error estimating sub-cell calculates a gain error loss function according to the cyclic correlation method and generates a corresponding preliminary estimation result of the gain error; and the clock phase error estimating sub-cell calculates a clock phase error loss function according to the cyclic correlation method and generates a corresponding preliminary estimation result of the clock phase error;

a low-pass filtering and accumulating cell 5, adapted to processing the preliminary estimation result and generating an error estimation result when receiving a corresponding setting signal;

wherein the low-pass filtering and accumulating cell 5 comprises at least one accumulating cell, or comprises at least one low-pass filter and one accumulating cell;

a counting cell 7, adapted to sending a setting signal to the low-pass filter accumulating cell and a correction parameter updating cell 6 according to a clock signal sampling cycle and a preset value, and sending a reset signal to each cell at the end of sampling; and the correction parameter updating cell 6, adapted to updating the clock correction parameter and the gain correction parameter according to the gradient descent method when receiving the corresponding setting signal, and latching the updated clock correction parameter and gain correction parameter.

In this embodiment, updating the clock correction parameter may change the sampling cycle of the second path of clock signal relative to the first path of clock signal, so that the clock displacements of the analog signals sampled by the two are closer to 180 degrees, at the same time, updating the gain correction parameter may change the gain error of the second path of digital signal relative to the first path of digital signal, thus improving the error correction accuracy.

Figure 3:
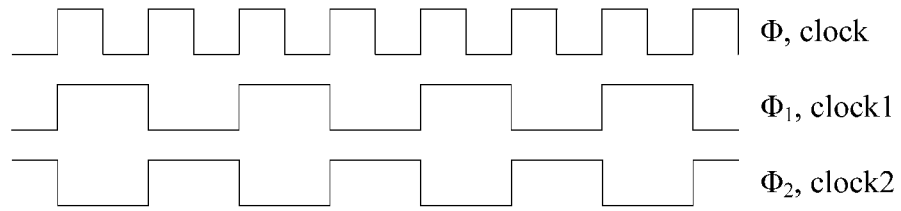
FIG. 3 shows a clock signal pulse diagram of a device for correcting error estimation of an analog-to-digital converter according to an embodiment of the present invention.

As shown in FIG. 3, it is a clock signal pulse diagram of a device for correcting error estimation of an analog-to-digital converter according to an embodiment of the present invention.

The clock signal (clock) comprises a first path of clock signal (clock 1) and a second path of clock signal (clock 2), and the first path of clock signal (clock 1) and the second path of clock signal (clock 2) are clock signals which are the same in cycle and have a displacement difference of 180 degrees.

In this embodiment, a fixed delay cell 9 is inserted in the reference channel ADC, a digital control delay cell 10 (DCDC) is inserted in a clock path of a correction channel ADC, the clock correction parameter is decoded into a binary control signal according to the clock correction parameter output by the correction parameter updating cell 6, and finely tuning the clock phase, to achieve the purpose of correcting the clock phase error. The gain correction cell 2 performs gain correction for the output signals (including the first path of digital signal and the second path of digital signal) of the two channel sub-ADCs according to the gain correction parameter, generating a second path of correction signal; the multiplexer 8MUX couples the first path of digital signal and the second path of correction signal and generates a general ADC output signal (i.e., a general correction signal), and the first path of digital signal and the second path of correction signal are input to the buffer cell 3 for buffering, and triggering the counting cell 7 to start counting; when the counting cell 7 counts up to a set value, an enable signal of the low-pass filtering and accumulating cell 5 is set (when the counted value of the counting cell 7 is equal to $N_1$) and an enable signal of the correction parameter updating cell 6 is set (when the counted value of the counting cell 7 is equal to N); the buffered signal of the buffer cell 3 is called, and the segmented error estimating cell 4 generates a preliminary estimation result from the first path of digital signal and the second path of correction signal according to the cyclic correlation method; when the enable end of the low-pass filter accumulating cell is set, the preliminary estimation result is input to the low-pass filter accumulating cell to estimate an error value and output an error estimation result; when the enable end of the correction parameter updating cell 6 is set, the error estimation result is input to the correction parameter updating cell 6, updating the clock correction parameter and the gain correction parameter, and latching the updated clock correction parameter and gain correction parameter. The register values of the buffer cell 3, the segmented error estimating cell 4, the low-pass filtering and accumulating cell 5 and the counting unit 7 are reset, and the enable signal of the correction parameter updating cell 6 and the enable signal of the low-pass filtering and accumulating cell 5 are reset; the above steps are repeated to achieve the correction convergence of error amount through continuous feedback, to achieve the purpose of real-time tracking and accurate error estimation correction.

Embodiment 2

A single-channel 250-MHz, dual-channel time-interleaved 500-MHz A/D converter with a sampling rate of 14 bits is used as an example for specific description. When the two channel sub-ADCs sample the input signal in parallel, and between sampling clocks, there is a phase difference of 180 degrees between the first clock signal and the second clock signal and the sampling cycle is 4 ns. The output data of the reference channel ADC is set as $y_1(n)$; the output data of the correction channel ADC is set as $y_2(n)$. DCDC is a digital control delay cell 10, which is controlled by an 8-bit binary code (0-255), totaling 256 codes. The delay step correspondingly adjusted with a unit code is 60 fs. A DCDC same as that in the clock path of the correction channel ADC is inserted in the clock path of the reference channel ADC, wherein, the control code of the DCDC in the clock path of the reference channel ADC is fixed to 128, and the fixed delay achieved is 7.68 ps; the control code of the DCDC in the clock path of the correction channel ADC is determined by a binary code corresponding to the clock correction parameter.

The total number of sample points that satisfy Equation (1) and Equation (2) are selected and if it is determined that the total number N of sample points for a single estimation is equal to 1000, the number $N_1$ of sample points processed by segmented estimation is equal to 50, and the number $N_2$ of duplicate sample points between segments is equal to 48, and then the number M of segments is equal to 475, and it is set that $N_3=N_1-N_2=2$.

The gain correction parameter and the clock correction parameter are set as $\Delta g^{(k)}$ and $\tau_{code}^{(k)}$, respectively, and the updating steps of the gain correction parameter and the clock correction parameter are $step_g^{(k)}$ and $step_\tau^{(k)}$, respectively, wherein the superscript k represents the result of the k-th updating of the correction parameter, the binary encoding of $\tau_{code}^{(k)}$ (i.e., the DCDC control signal in the correction channel ADC), then the value range of $\tau_{code}^{(k)}$ is (0-255). The initial value of the gain correction parameter is set as $\Delta g^{(0)}=0$, and the initial gain correction amount is 0. The initial value of the clock phase correction parameter is set as $\tau_{code}^{(0)}=128$. In this case, the clock delay amount of the correction channel ADC is the same as the clock delay amount of the reference channel ADC, and the initial clock phase correction amount is 0; when $\tau_{code}^{(k)}$ decreases, the advance adjustment for the clock phase of the correction channel is achieved, and when $\tau_{code}^{(k)}$ increases, lag adjustment for the clock phase of the correction channel is achieved. The accuracy of the gain correction parameter is set as 0.0121%, and the initial value of the updating step of the gain correction parameter is set as $step_g^0=0.0121\%=128$; the accuracy of the clock correction parameter is set as 1, and the initial value of the updating step of the clock correction parameter is set as $step_\tau^0=128$.

In the adaptive processor, the gain correcting cell 2 corrects the sub-ADC output data of the two channels according to the estimated gain correction parameter $\Delta g^{(k)}$, and the operation is performed as shown in Equation (5) and Equation (6):

$$x_1(n)=y_1(n) \tag{5}$$

$$x_2(n)=y_2(n)\cdot(1+\Delta g^{(k)}) \tag{6}$$

Figure 4:
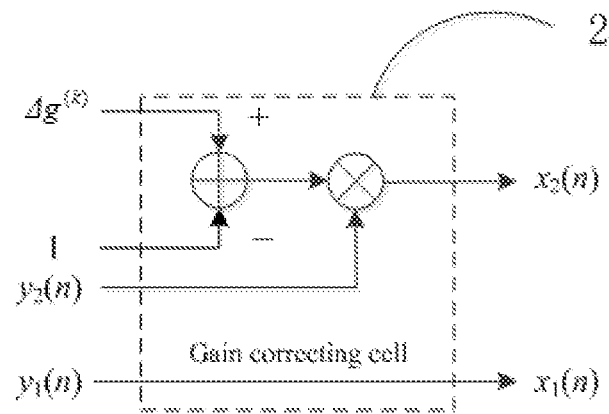
FIG. 4 shows a structural block diagram of a gain correcting cell in an adaptive signal processor according to an embodiment of the present invention.
Figure 5:
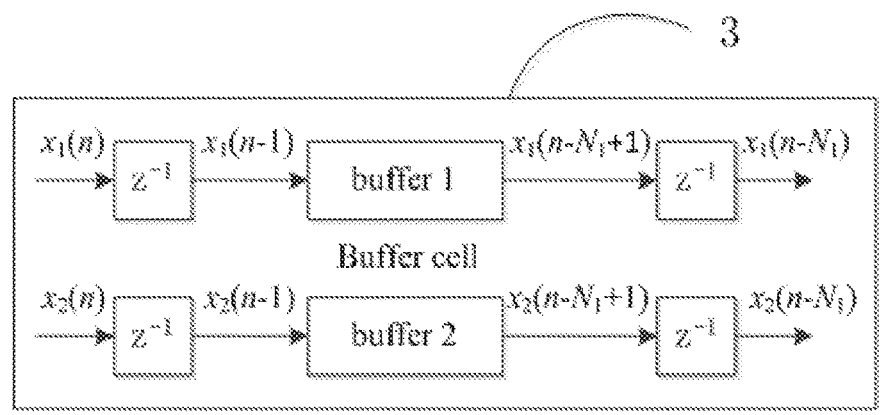
FIG. 5 shows a structural block diagram of a buffer cell in an adaptive signal processor according to an embodiment of the present invention.
Figure 6:
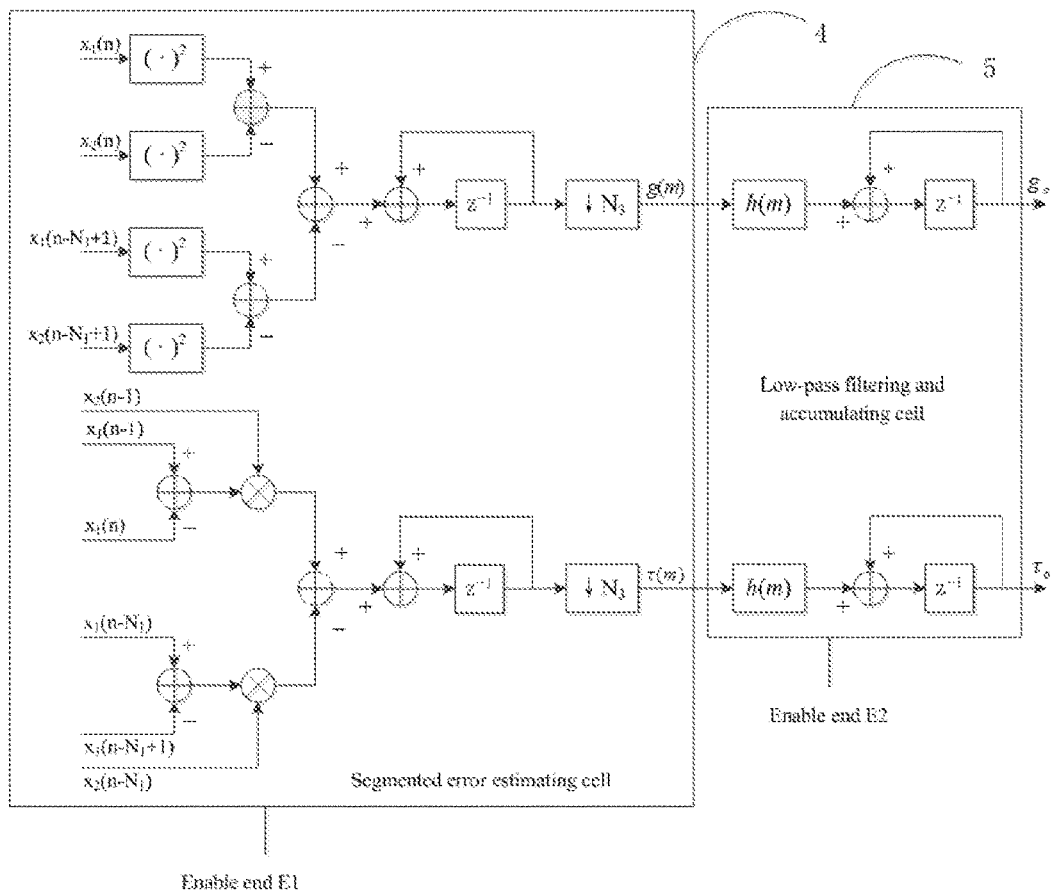
FIG. 6 shows a structural block diagram of a segmented error estimating cell and a low-pass filtering and accumulating cell in an adaptive signal processor according to an embodiment of the present invention.
Figure 7:
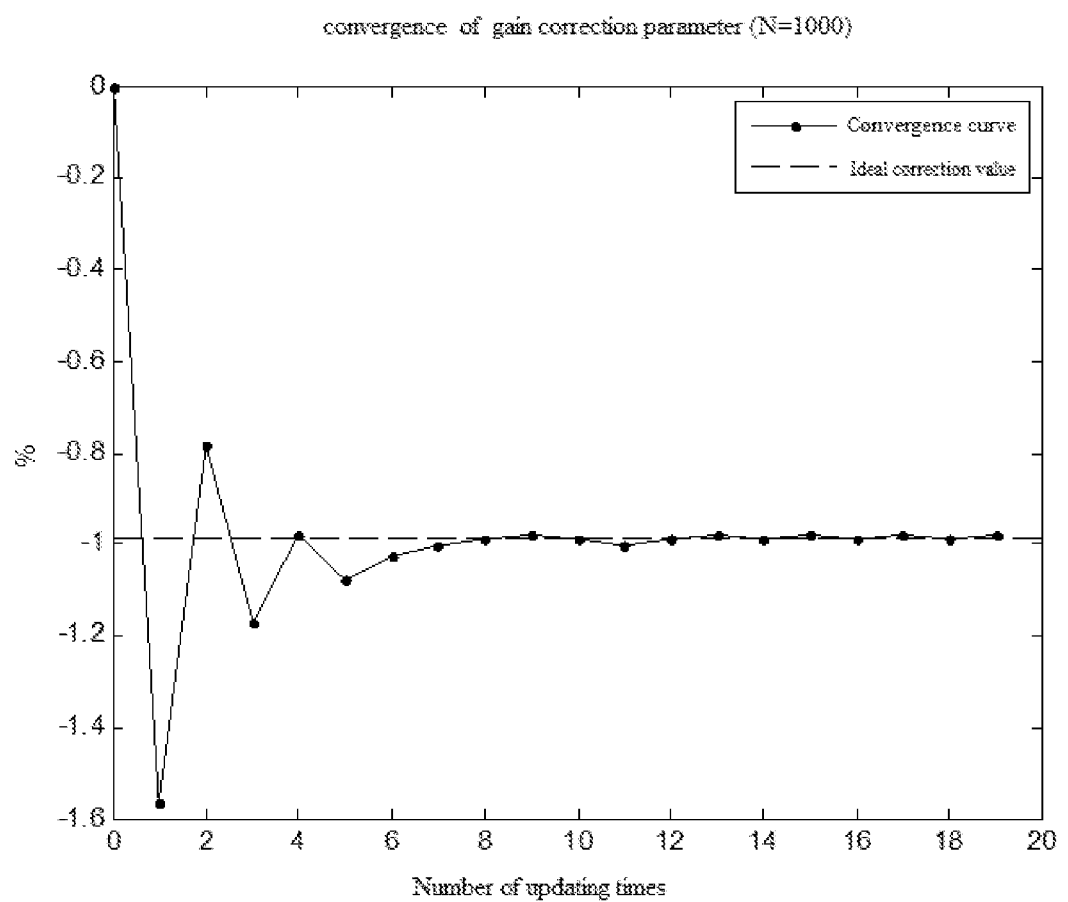
FIG. 7 shows a convergence curve of an analog-to-digital converter error estimation correction gain error correction parameter in an embodiment of the present invention.
Figure 8:
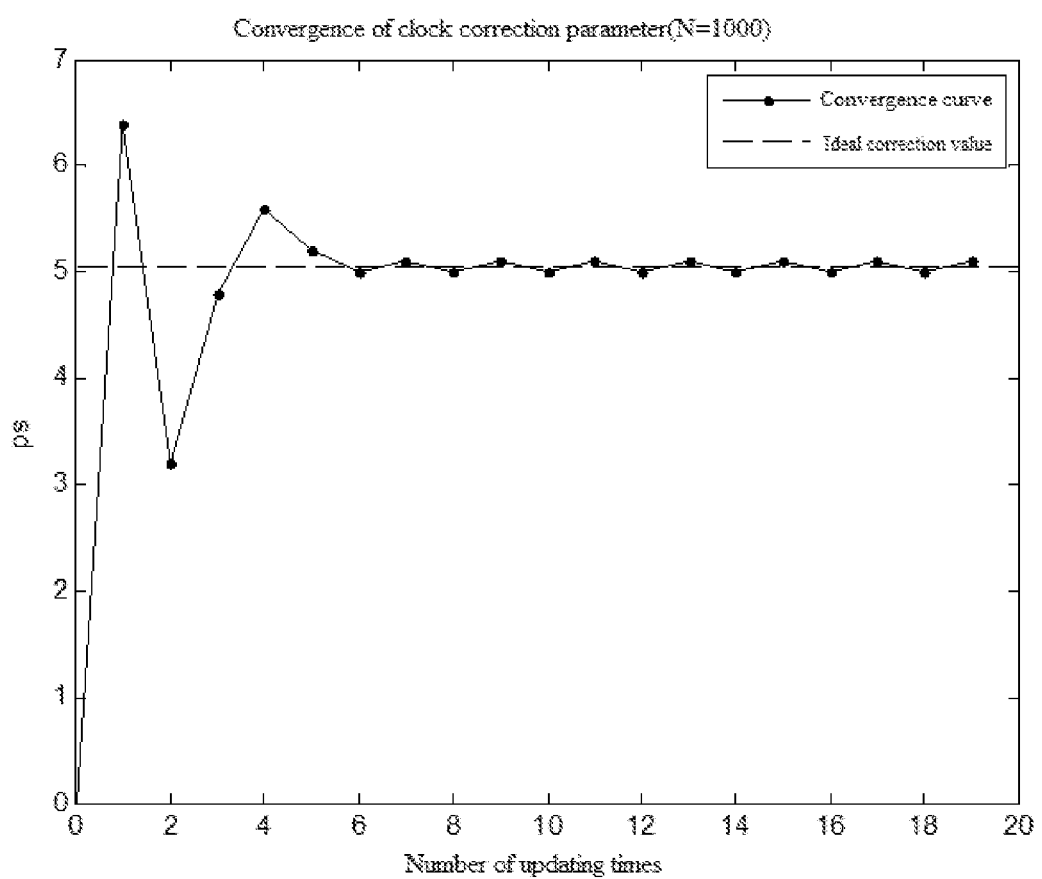
FIG. 8 shows a convergence curve of an analog-to-digital converter error estimation correction clock phase error correction parameter in an embodiment of the present invention.

The two output results of the gain correcting cell 2 are shown in FIG. 4 to FIG. 6 and are synthesized by the multiplexer 8MUX into the general ADC output x(n), wherein $x(2n)=x_1(n)$, $x(2n+1)=x_2(n)$; meanwhile, the first path of digital signal and the second path of correction signal are saved in the buffer cell 3 for error estimation.

Using a cyclic correlation function $R(n,n')=E\{x(n)x(n')\}$, there is a function $R(n,n')=R(n+2,n'+2)$ according to the dual-channel time division multiplexing ADC; the error function is defined as $e(u)=R(u,0)-R(u+1,1)$, the error loss function is defined as $P=\text{argmin}(e(u)^2)$; if there is no mismatch error between the two channels, then $P=0$.

If there is a mismatch error between the two channels, the correction parameter is updated by using a gradient descent algorithm; e(u) is a monotonic function of the mismatch error. From $$\frac{\partial P}{\partial \Delta} = e(u) \cdot \frac{\partial e(u)}{\partial \Delta},$$

it can be known that the gradient of the error loss function is proportional to the error loss function e(u) and the gradient information of an error loss function can be obtained through calculating the error loss function to update the correction parameter. Let u=0 to obtain the gain error loss function as:

$$e_g = E\{x_1^2(n)\} - E\{x_2^2(n)\} \tag{7}$$

Let u=1 to obtain the clock phase error loss function as:

$$e_\tau = E\{x_1(n)x_2n)x(n)\} - E\{x_1(n+1)x_2(n)\} \tag{8}$$

In actual implementation, a certain length of sample points is taken to calculate the error loss function. The mathematical expression is as follows:

$$e_g = \frac{1}{N}\sum_{n=0}^{N-1}[x_1^2(n) - x_2^2(n)] \tag{9}$$

$$e(\tau) = \frac{1}{N}\sum_{n=0}^{N-1}[x_1(n)x_2(n) - x_1(n+1)x_2(n)] \tag{10}$$

In the above equation, n is a variable and the range of its values includes natural numbers. Wherein the error loss function is calculated by using a segmented calculation and filtering accumulation method, the number of sample points used for a single estimation is reduced under the same estimation accuracy.

Using the principles of equations (9) and (10), the segmented error estimating cell 4 uses the input and output data in the buffer cell 3 to perform an operation to implement a preliminary estimation of the gain error and the clock phase error, and the operation is performed as shown in equations (11) and (12):

The preliminary estimation result of the gain error:

$$g(m) = \sum_{n=1}^{N_1}[x_1^2(n+m\cdot N_3) - x_2^2(n+m\cdot N_3)] \tag{11}$$

The preliminary estimation result of the clock phase error:

$$\tau(m) = \sum_{n=1}^{N_1} [x_1(n+m \cdot N_3)x_2(n+m \cdot N_3) - x_1(n+1+m \cdot N_3)x_2(n+m \cdot N_3)] \quad (12)$$

$$= \sum_{n=1}^{N_1} [x_1(n+m \cdot N_3) - x_1(n+1+m \cdot N_3)] \cdot x_2(n+m \cdot N_3)$$

wherein, m=0, . . . , M−1.

After the enable signal of the segmented error estimating cell 4 is set, the low-pass filtering and accumulating cell 5 processes the output result of the segmented error cell to obtain the error estimation result, and the operation is performed as shown in equations (13) and (14):

Gain error estimation result:

$$g_0 = \sum_{m=0}^{M-1} [g(m) \otimes h(m)] \quad (13)$$

Clock phase error estimation result:

$$\tau_0 = \sum_{m=0}^{M-1} [\tau(m) \otimes h(m)] \quad (14)$$

wherein h(m) is a low-pass filter and ⊗ is a convolution symbol. Since the accumulation itself can be regarded as a low-pass filter, in this embodiment, when h(m)=1, then equations (13) and (14) are respectively simplified into:

$$g_0 = \sum_{m=0}^{M-1} g(m) \quad (15)$$

$$\tau_0 = \sum_{m=0}^{M-1} \tau(m) \quad (16)$$

$g_0$ and $\tau_0$ are the calculated error loss functions, and when the enable signal of the correction parameter updating cell 6 is set, the outputs $g_0$ and $\tau_0$ of the low-pass filtering and accumulating cell 5 are latched and the latched $g_0$ and $\tau_0$ are input to the correction parameter updating cell 6, and the updating of the correction parameter is completed using the gradient descent method.

The updating expression of the gain correction parameter is:

$$\Delta g^{(k)} = \Delta g^{(k-1)} + \text{sign}(g_0) \cdot \text{step}_g^{(k-1)} \quad (17)$$

$$\text{or } \Delta g^{(k)} = \Delta g^{(k-1)} + g_0 \cdot \text{step}^{(k-1)} \quad (18)$$

The updating expression of the clock correction parameter is:

$$\tau_{code}^{(k)} = \tau_{code}^{(k-1)} + \text{sign}(\tau_0) \cdot \text{step}_\tau^{(k-1)} \quad (19)$$

$$\text{or } \tau_{code}^{(k)} = \tau_{code}^{(k-1)} + \tau_0 \cdot \text{step}_\tau^{(k-1)} \quad (20)$$

wherein sign is a symbol function, when $g_0$ or $\tau_0$ is greater than or equal to 0, $\text{sign}(g_0/\tau_0)=1$; that is, from the time 0, the amplitude of the signal is 1; when $g_0$ or $\tau_0$ is less than 0, $\text{sign}(g_0/\tau_0)=-1$; before the time 0, the amplitude of the signal is −1.

In this embodiment, when the gain correction parameter is an equation, the correction parameters are updated using equations (17) and (19).

In this embodiment, a binary tree search method is used to update the updating steps of the correction parameters, that is, every time a correction parameter is updated, the updating step of the correction parameter is reduced by half until the updating step reaches the set accuracy of the correction parameter. The updating steps can also be updated in other ways. In this embodiment, every time the clock correction parameter is updated, the parameter updating step corresponding to the clock correction parameter is reduced by half; and every time the gain correction parameter is updated, the parameter updating step corresponding to the gain correction parameter is reduced by half. The implementation expressions of the updating steps of the correction parameters are shown as equations (21) and (22).

$$\text{step}_g^{(k)} = \max\{\text{step}_g^{(k-1)}/2, 0.0121\%\} \quad (21)$$

$$\text{step}_\tau^{(k)} = \max\{\text{step}_\tau^{(k-1)}/2, 1\} \quad (22)$$

According to the assumed value, the gain error between the two channels is calculated to be 1%, the clock phase error is 5.05 ps, and the ADC inputs a 95.1 MHz sinusoidal signal.

In the conversion process of the dual-channel time division multiplexing analog-to-digital converter, the gain error estimation result and the clock phase error estimation result, as well as the gain error and the clock phase error, are corrected by adopting the above-mentioned method or device for correcting error estimation. In the correction process, the convergence curves of the gain error parameter and the clock phase error parameter are respectively shown in FIG. 7 to FIG. 8. Within a few times, with the constant updating of the correction parameters, the gain correction parameter and the time correction parameter gradually tend to corresponding ideal correction values as the number of updates increases, and the corresponding convergence curves are formed within a shorter time.

Figure 9:
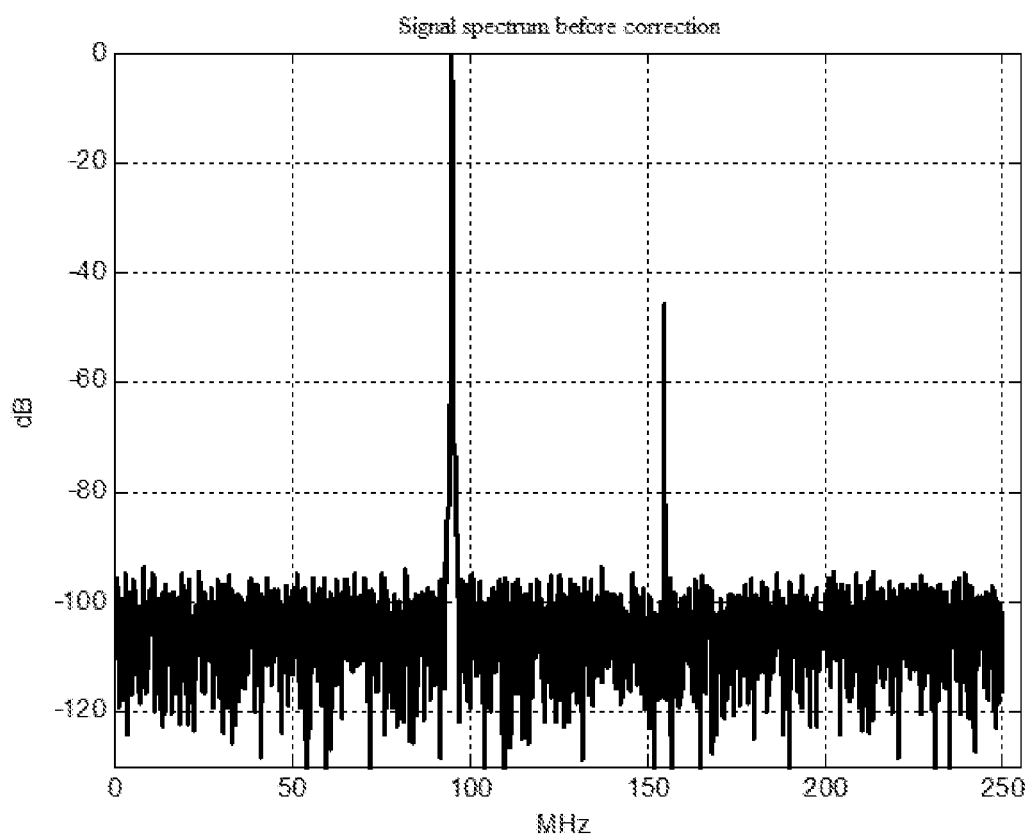
FIG. 9 shows a simulation diagram comparing the dynamic performance of an analog-to-digital converter before error estimation correction in an embodiment of the present invention.
Figure 10:
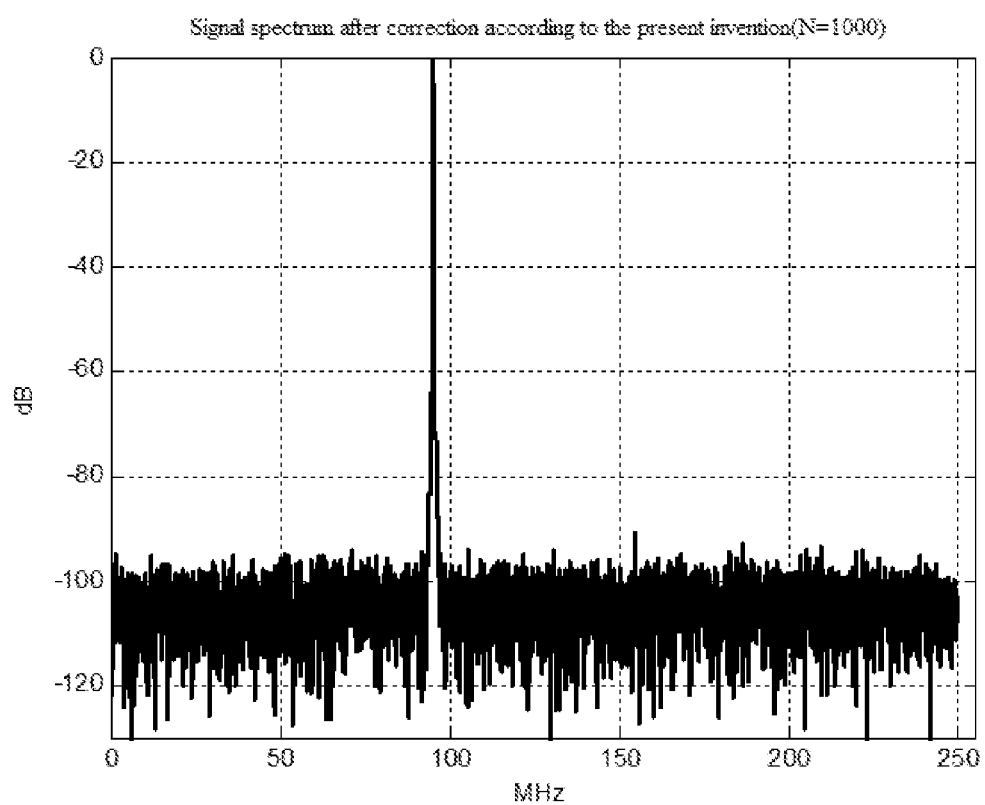
FIG. 10 shows a simulation diagram comparing the dynamic performance of the analog-to-digital converter after error estimation correction in an embodiment of the present invention.
Figure 11:
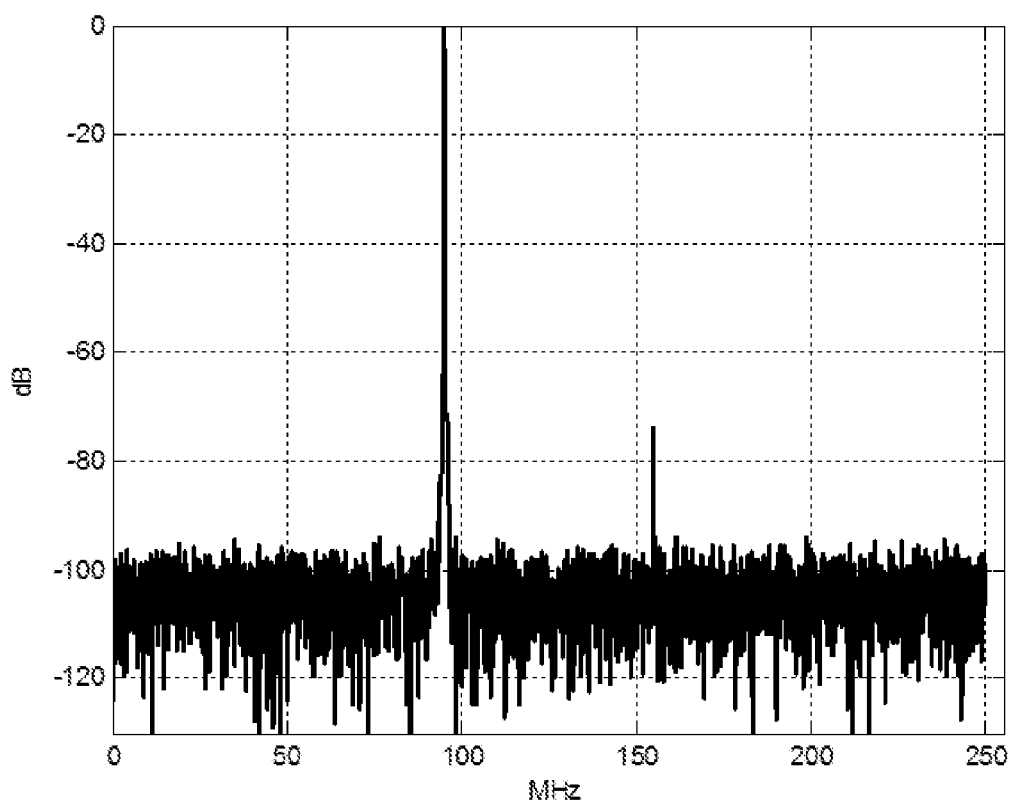
FIG. 11 shows a simulation diagram of dynamic performance before correction using a conventional correction method based on statistical method in an embodiment of the present invention.

As shown in FIG. 9 to FIG. 10, they are simulation diagrams comparing the dynamic performance of the analog-to-digital converter before and after error estimation correction respectively in an embodiment of the present invention; By adopting the device and method for correcting error estimation in the present invention, the spurious frequency caused by gain and clock phase errors can be effectively suppressed, and the purpose of accurate estimation and correction can be achieved. As shown in FIG. 11, it is a simulation diagram of dynamic performance after correction using a conventional correction method based on statistical method in an embodiment of the present invention. Comparing FIG. 9, FIG. 10, and FIG. 11, it can be seen that by using the same number of sample points, and in the case of a single estimation, the method proposed by the present invention has higher estimation accuracy and better correction effect than the conventional method; the conventional method needs to use more sample points to achieve the same correction accuracy as the method of the present invention.

Figure 12:
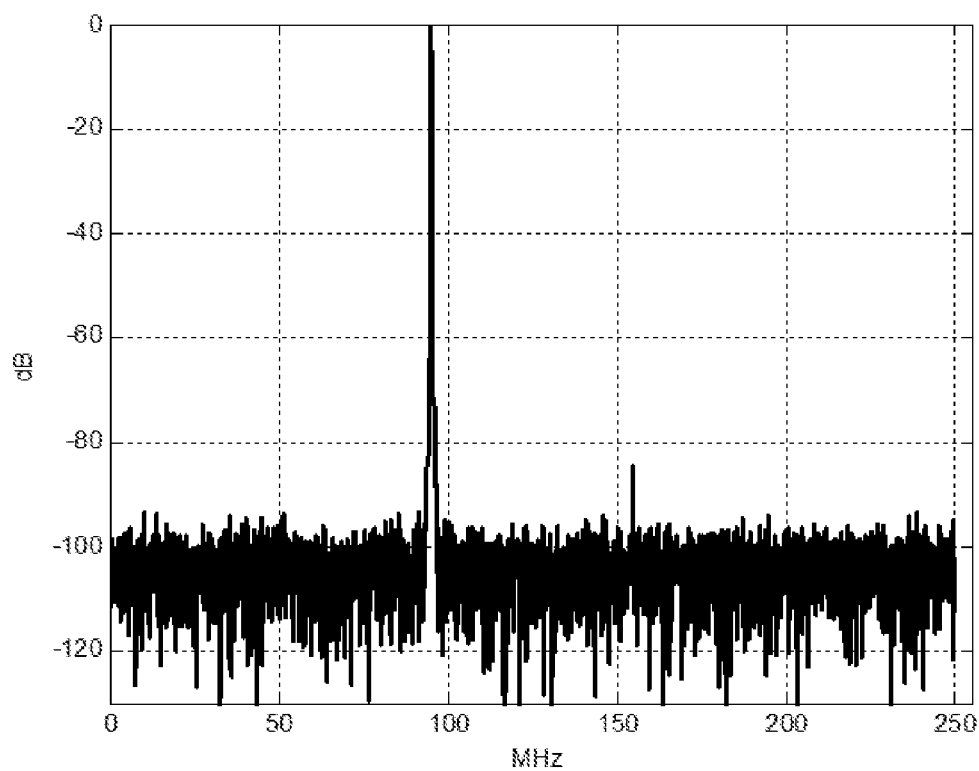
FIG. 12 shows a simulation diagram of dynamic performance after correction using the conventional correction method based on statistical method in an embodiment of the present invention.

As shown in FIG. 12, it is a simulation diagram of dynamic performance after correction using a conventional correction method based on statistical method. The number of sample points used is N=10000; and in the case of a single estimation, the simulation correction result formed is similar to the correction result of the present invention where the number of points used is set as N=1000. Therefore, the device and method for correcting error estimation of the present invention can achieve the same correction accuracy, and the number of sample points sampled for correction can be greatly reduced.

To sum up, correcting a clock signal sampled between channels and the second path of digital signal by setting an adaptive signal processor, obtaining the corresponding clock phase error estimation result and gain error estimation result through the first path of digital signal and the second path of correction signal, latching the clock phase error estimation result and the gain error estimation result, and obtaining the corresponding clock correction parameter and gain correction parameter, and feeding them back to the digital control delay cell 10 and the gain correcting cell 2, respectively, to achieve accurate adjustment of the feedback error. When the analog input signal of the TI ADC is within the Nyquist sampling bandwidth, the estimation correction process only needs to utilize output signals normally sampled by two channel sub-ADCs, without the need to additionally add other auxiliary analog signals at a sub-ADC input or sub-ADC circuitry, and the estimation correction process does not depend on the specific circuit implementation structure of a sub-ADC; and each estimation requires fewer effective sample points, and in real-time correction, the requirement for the effective signal duration is reduced, and the convergence rate of the estimation correction is increased; and in the case of the same error estimation accuracy, the correction of the error estimation using a single estimation method can greatly reduce the number of sample points sampled, and at the same time, the convergence rate of the error estimation is greatly reduced. Therefore, the present invention effectively overcomes the various disadvantages in the prior art and has a high industrial utilization value.

The above-mentioned embodiments merely illustrate the principle of the present invention and its efficacy, but are not intended to limit the present invention. Any person skilled in the art can make modifications or changes to the above-mentioned embodiments without departing from the spirit and scope of the present invention. Therefore, all equivalent modifications or changes made by those skilled in the art without departing from the spirit and technical concepts disclosed in the present invention should still be covered by the claims of the present invention.

What is claimed is:

1. A device for correcting error estimation of an analog-to-digital converter, wherein at least comprising:
   a dual-channel time division multiplexing analog-to-digital converter, adapted to using a reference clock signal and a correction clock signal for sampling in a reference channel and a correction channel, respectively, and generating a corresponding first path of digital signal and second path of digital signal, and
   an adaptive digital signal processor, adapted to calculating a clock phase error estimation result and a gain error estimation result of the second path of digital signal according to a preset initial value of a correction parameter updating cell, the first path of digital signal and the second path of digital signal, wherein the initial value of the correction parameter updating cell comprises an initial value of a gain correction parameter and an initial value of a time correction parameter; and further adapted to adopting a gradient descent method, updating the time correction parameter according to the clock phase error estimation result, and updating the gain correction parameter according to the gain error estimation result.

2. The device for correcting error estimation of an analog-to-digital converter according to claim 1, wherein the adaptive digital signal processor at least comprises:
   a gain correcting cell, adapted to performing gain correction for the second path of digital signal according to the initial value of the gain correction parameter, and generating a second path of correction signal;
   a buffer cell, adapted to buffering the first path of digital signal and the second path of correction signal;
   a segmented error estimating cell, adapted to calling the first path of digital signal and the second path of correction signal, and using a cyclic correlation method for processing, and generating a preliminary estimation result, wherein the preliminary estimation result comprises a preliminary estimation result of a gain error and a preliminary estimation result of a clock phase error;
   a low-pass filtering and accumulating cell, adapted to processing the preliminary estimation result and generating an error estimation result when receiving a corresponding setting signal;
   a counting cell, adapted to sending a setting signal to the low-pass filter accumulating cell and a correction parameter updating cell respectively according to a clock signal sampling cycle and a preset value, and sending a reset signal to each cell; and
   the correction parameter updating cell, adapted to updating the clock correction parameter and the gain correction parameter according to the gradient descent method when receiving the corresponding setting signal, and latching the updated clock correction parameter and gain correction parameter.

3. The device for correcting error estimation of an analog-to-digital converter according to claim 2, wherein the segmented error estimating cell comprises a gain error estimating sub-cell and a clock phase error estimating sub-cell, and the gain error estimating sub-cell is adapted to calculating a gain error loss function according to the cyclic correlation method, and generating a corresponding preliminary estimation result of the gain error, and the clock phase error estimating sub-cell is adapted to calculating a clock phase error loss function according to the cyclic correlation method, and generating a corresponding preliminary estimation result of the clock phase error.

4. The device for correcting error estimation of an analog-to-digital converter according to claim 2, wherein the low-pass filtering and accumulating cell comprises at least one accumulating cell, or comprises at least one low-pass filter and one accumulating cell.

5. The device for correcting error estimation of an analog-to-digital converter according to claim 2, wherein working clocks of the gain correcting cell, the buffer cell, the counting cell, the segmented error estimating cell and the low-pass filtering and accumulating cell are the clock signal.

6. The device for correcting error estimation of an analog-to-digital converter according to claim 1, wherein further comprising:
   a delay cell, comprising a fixed delay cell and a digital control delay cell, the fixed delay cell is adapted to setting a delay in a reference channel, generating a reference clock delay amount, and controlling the clock phase of the first path of digital signal; and the digital control delay cell is adapted to generating a control signal according to a time correction parameter, generating a correction clock delay amount, and finely tuning the clock phase of the second path of digital signal so that the clock phase of the second path of digital signal is matched with the clock phase of the first path of digital signal.

7. The device for correcting error estimation of an analog-to-digital converter according to claim 1, wherein the analog-to-digital converter further comprises a multi-channel time division multiplexing analog-to-digital converter.

8. A method for correcting error estimation of an analog-to-digital converter, wherein comprising:
step 1, presetting an initial value of a correction parameter updating cell, wherein the initial value of the correction parameter updating cell comprises an initial value of a clock correction parameter and an initial value of a gain correction parameter;
step 2, calling the initial value of the clock correction parameter for decoding to generate a control signal, and finely tuning the delay amount of a digital control delay cell according to the control signal, correcting a phase error of the sampling clock of a second path of digital signal relative to the sampling clock of a first path of digital signal;
step 3, performing gain correction for the second path of digital signal according to the initial value of the gain correction parameter, generating a second path of correction signal, buffering and coupling the first path of digital signal and the second path of correction signal, generating a general correction signal, and triggering a counting cell to start counting;
step 4, calling the buffered first path of digital signal and second path of correction signal and using a cyclic correlation method for processing, and generating a preliminary estimation result; and
step 5, when the counting cell counts up to a preset value and an edge of a clock signal arrives, setting enable ends of a low-pass filter accumulating cell and a correction parameter updating cell, generating an error estimation result from the preliminary estimation result, and updating and latching the clock correction parameter and the gain correction parameter according to the error estimation result.

9. The method for correcting error estimation of an analog-to-digital converter according to claim 8, wherein after step 5, the method further comprises: when the counting cell counts up to the preset value and the edge of the clock signal arrives, resetting enable ends of a buffer cell, a low-pass filtering and accumulating cell, a segmented error estimating cell, the correction parameter updating cell, the low-pass filtering and accumulating cell and the counting unit, and repeating step 2 to step 5.

10. The method for correcting error estimation of an analog-to-digital converter according to claim 8, wherein the step 2 specifically comprises:
setting a fixed delay cell in the reference channel, obtaining a reference clock delay amount output by the reference channel; setting the digital control delay cell in a correction channel, and obtaining a correction clock delay amount output by the correction channel; and
decoding the clock correction parameter into a binary code; taking the binary code as a control signal, when the actual delay amount corresponding to the control signal is less than the reference clock delay amount, the clock phase of the second path of digital signal is shifted forward; when the actual delay amount corresponding to the control signal is greater than the reference clock delay amount, the clock phase of the second path of digital signal is shifted backward.

11. The method for correcting error estimation of an analog-to-digital converter according to claim 8, wherein the step 3 specifically comprises:
obtaining a product of the second path of digital signal and the gain correction parameter by a multiplier, and obtaining a sum of an output of the multiplier and the second path of digital signal by an adder; or
obtaining a sum of the gain correction parameter and an original multiple by an adder, and obtaining a product of the second path of digital signal and the output of the adder by a multiplier.

12. The method for correcting error estimation of an analog-to-digital converter according to claim 11, wherein gain error correction is performed according to the second path of digital signal, outputting a second path of correction signal, timing sequences of the first path of digital signal and the second gain correction signal are aligned, and coupling and generating a general correction signal.

13. The method for correcting error estimation of an analog-to-digital converter according to claim 8, wherein the step 4 of calling the buffered first path of digital signal and second path of correction signal and using a cyclic correlation method for processing, and generating a preliminary estimation result, specifically comprises the following:
wherein the preliminary estimation result comprises a preliminary estimation result of a gain error and a preliminary estimation result of a clock phase error, calling the first path of digital signal and the second path of correction signal, calculating a gain error loss function according to the cyclic correlation method, and generating a corresponding preliminary estimation result of the gain error; and calculating a clock phase error loss function according to the cyclic correlation method, generating a corresponding preliminary estimation result of the clock phase error.

14. The method for correcting error estimation of an analog-to-digital converter according to claim 8, wherein the step 5 of generating an error estimation result from the preliminary estimation result, and updating and latching the clock correction parameter and the gain correction parameter according to the error estimation result, specifically comprises:
when the enable end of the low-pass filtering and accumulating cell is set, processing the preliminary estimation result, generating an error estimation result, the error estimation result comprises a gain error estimation result and a clock phase error estimation result; when the enable end of the correction parameter updating cell is set, latching the error estimation result, calling the error estimation result, updating the clock correction parameter and the gain correction parameter according to a gradient descent method, and latching the updated clock correction parameter and gain correction parameter.

15. The method for correcting error estimation of an analog-to-digital converter according to claim 14, wherein every time the clock correction parameter is updated in step 5, the parameter updating step corresponding to the clock correction parameter is reduced by half; and every time the gain correction parameter is updated, the parameter updating step corresponding to the gain correction parameter is reduced by half.

* * * * *